(12) United States Patent
Kominsky

(10) Patent No.: US 6,686,781 B2
(45) Date of Patent: Feb. 3, 2004

(54) TIMING CONTROL CIRCUIT

(75) Inventor: Richard A. Kominsky, Westfield, MA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 10/121,796

(22) Filed: Apr. 12, 2002

(65) Prior Publication Data

US 2003/0193356 A1 Oct. 16, 2003

(51) Int. Cl.$^7$ ................................................. H03K 3/02
(52) U.S. Cl. ......................... 327/141; 327/142; 327/198
(58) Field of Search ............................... 327/141, 142, 327/143, 197, 198, 199; 363/21.12, 80; 329/319

(56) References Cited

U.S. PATENT DOCUMENTS

| | | | | |
|---|---|---|---|---|
| 4,413,313 A | * | 11/1983 | Robinson | 363/80 |
| 4,463,317 A | * | 7/1984 | Kusakabe | 329/319 |
| 5,729,443 A | * | 3/1998 | Pavlin | 363/21.12 |

OTHER PUBLICATIONS

National Semiconductor, 1995 Power IC Databook, pp. 3–3 and 3–39.
Texas Instruments, TPS67341, Fixed 12–V 120–mA Boost–Converter Supply, p. 4–148, Aug. 1995.
National Semiconductor, Application Note 115, Wide Range Function Generator, pp. 369–371, date unknown.
National Semiconductor, Application Note 30, Log Converters, pp. 76–79, date unknown.
National Semiconductor, Application Note 240, Robert A. Pease, Wide–Range Current–to–Frequency Converters, pp. 574–579, date unknown.
HFPC, Apr. 1994 Proceedings, pp. 154, 165, 166, 167.

* cited by examiner

Primary Examiner—Timothy P. Callahan
Assistant Examiner—Linh Nguyen
(74) Attorney, Agent, or Firm—Cantor Colburn LLP

(57) ABSTRACT

A timing circuit having a controllable current source and a capacitor coupled to the current source. A resistor and a second capacitor are connected in series. The series resistor and second capacitor are connected in parallel with the capacitor. A trigger circuit has a first terminal coupled to the capacitor. The trigger circuit changes states when a voltage at the first terminal exceeds a reference voltage.

16 Claims, 4 Drawing Sheets

TIMING CONTROL CIRCUIT

BACKGROUND OF THE INVENTION

The invention relates generally to timing control circuits and in particular to a timing control circuit providing a wide dynamic range. Timing circuits are used in a number of applications such as pulse width modulation (PWM), voltage controlled oscillators (VCO), etc. FIG. 1 is a schematic diagram of an existing timing circuit 10 used in a PWM application. As known in the art, a PWM signal is a series of pulses. A controllable current source 12 is used to charge a capacitor 14. When the capacitor 14 reaches a certain voltage, established by a reference voltage applied to the inverting terminal of operational amplifier 16, operational amplifier 16 changes states causing a pulse to end.

A drawback to the circuit of FIG. 1 is that it is difficult to provide a large dynamic range. For a given value of capacitor 14, a very large current is needed to generate narrow pulse widths (i.e., rapid charging of capacitor 14). On the other hand, very small current is needed to provide wide pulse widths (i.e., slow charging of capacitor 14). Unfortunately, controlling small currents can be difficult leading to unstable, wide pulse widths.

If capacitor 14 is increased in value to allow larger currents to be used for larger pulse widths, this creates a detriment in generating narrow pulse widths. If capacitance of capacitor 14 is increased, then larger currents are need to generate small pulse widths. Thus, it is difficult to provide a wide dynamic range pulse widths with the existing timing circuit.

BRIEF SUMMARY OF THE INVENTION

An exemplary embodiment of the invention is a timing circuit comprising a controllable current source and a capacitor coupled to the current source. A resistor and a second capacitor are connected in series. The series resistor and second capacitor are connected in parallel with the capacitor. A trigger circuit has a first terminal coupled to the capacitor. The trigger circuit changes states when a voltage at the first terminal exceeds a reference voltage.

BRIEF DESCRIPTION OF THE DRAWINGS

Referring now to the drawings, wherein like elements are numbered alike in the several FIGURES.

DETAILED DESCRIPTION

Figure 1:
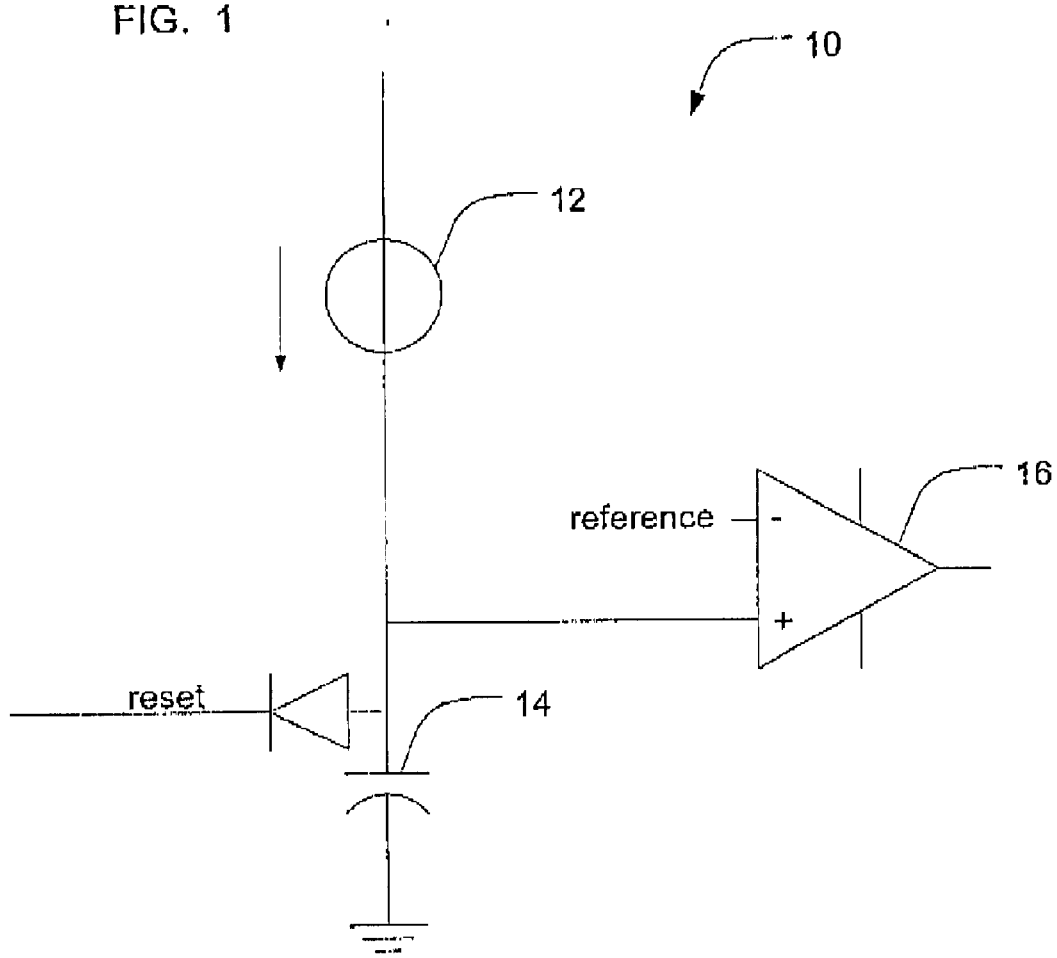
FIG. 1 is a schematic diagram of a conventional timing circuit.
Figure 2:
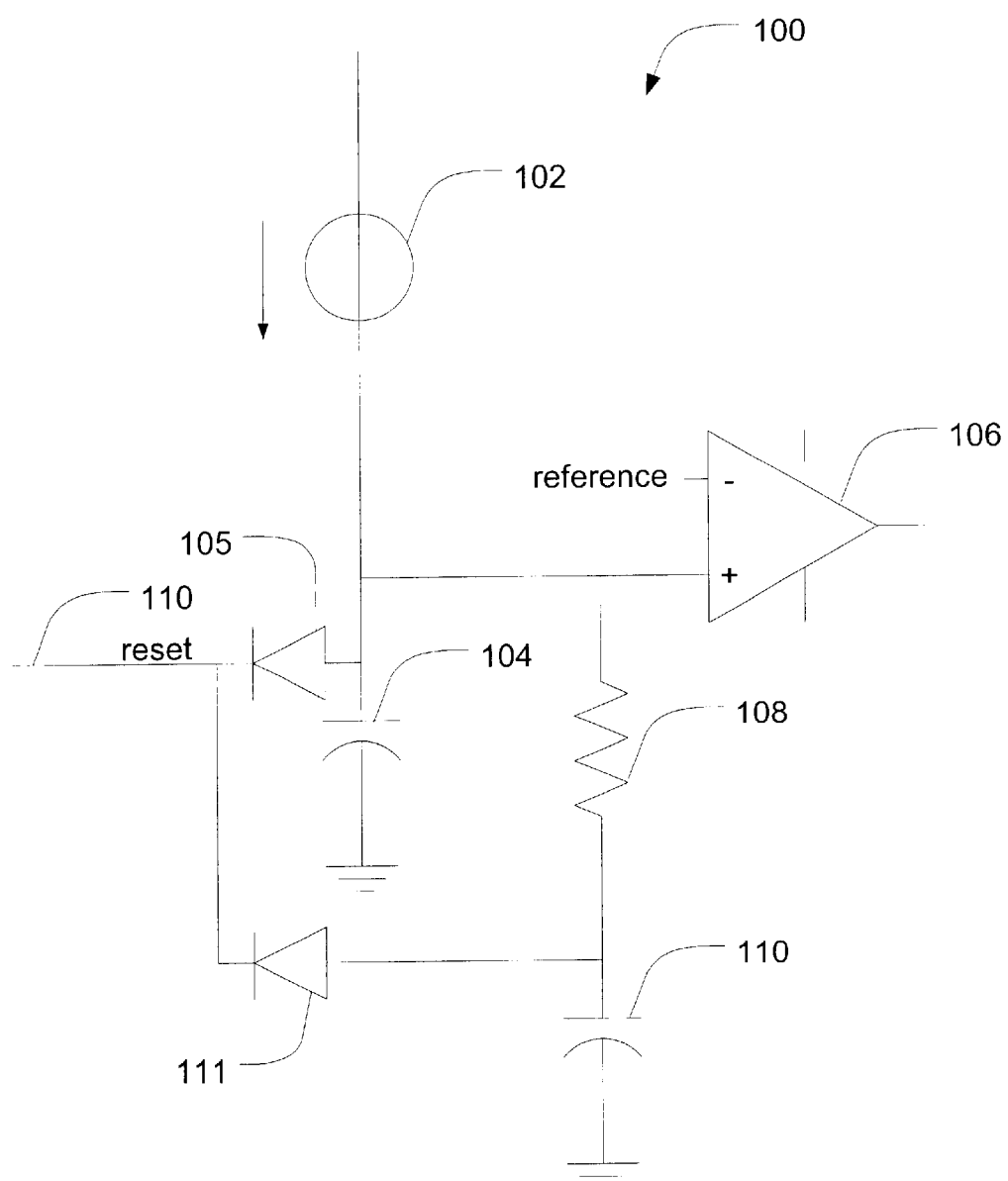
FIG. 2 is a schematic diagram of a timing circuit in an embodiment of the invention.

FIG. 2 is a schematic diagram of a timing circuit 100 in an embodiment of the invention. The circuit includes a controllable current source 102 which charges capacitor 104 and charges capacitor 110 through resistor 108. Capacitor 104 is in parallel with series connected resistor 108 and capacitor 110. One terminal of capacitor 104 is connected to a first terminal of a trigger circuit 106 and the other terminal is connected to ground. In the embodiment of FIG. 2, the trigger circuit 106 is implemented using an operational amplifier but it is understood that other devices may be used. The output of trigger circuit 106 may be applied to a signal generator in various applications such as PWM and VCO to trigger the end of a pulse. A reset terminal 110 provides for discharge of capacitors 104 and 110 through diodes 105 and 111, respectively.

One terminal of resistor 108 is connected to the first terminal of trigger circuit 106 and one terminal of capacitor 110 is connected to ground. Thus, the charge across capacitors 104 and 110 dictate the voltage at the first terminal of trigger circuit 106. When the voltage on the first terminal of trigger circuit 106 reaches a threshold, the trigger circuit changes states thereby ending the pulse. The threshold voltage is established by a reference voltage applied to the second terminal of the trigger circuit.

By selecting appropriate values for capacitor 104, capacitor 110 and resistor 108, a wide dynamic range may be achieved. In general, capacitor 104 should have a capacitance lower than the capacitance of capacitor 110. In an exemplary embodiment of the invention, capacitor 104 is 100 pf, capacitor 110 is 4700 pf and resistor 108 is 10 k ohms. Accordingly, when a small pulse width is desired, a large current is applied. Resistor 108 limits the charge of capacitor 110 and the effective capacitance at the first terminal is substantially capacitor 104. Capacitor 104 reaches the reference voltage quickly causing trigger circuit 106 to change states and produce a narrow pulse. When a large pulse width is desired, a small current is applied which resistor 108 does not significantly impede. Thus, both capacitor 104 and capacitor 110 may be charged by smaller currents. This renders the effective capacitance the parallel combination of capacitor 104 and capacitor 110. A longer time is needed to charge capacitor 104 and capacitor 110 to the reference voltage resulting in a wide pulse width. Accordingly, more current may be used to achieve wide pulse widths as compared to using just capacitor 104 alone. This avoids using diminutive currents that are difficult to control.

Figure 3:
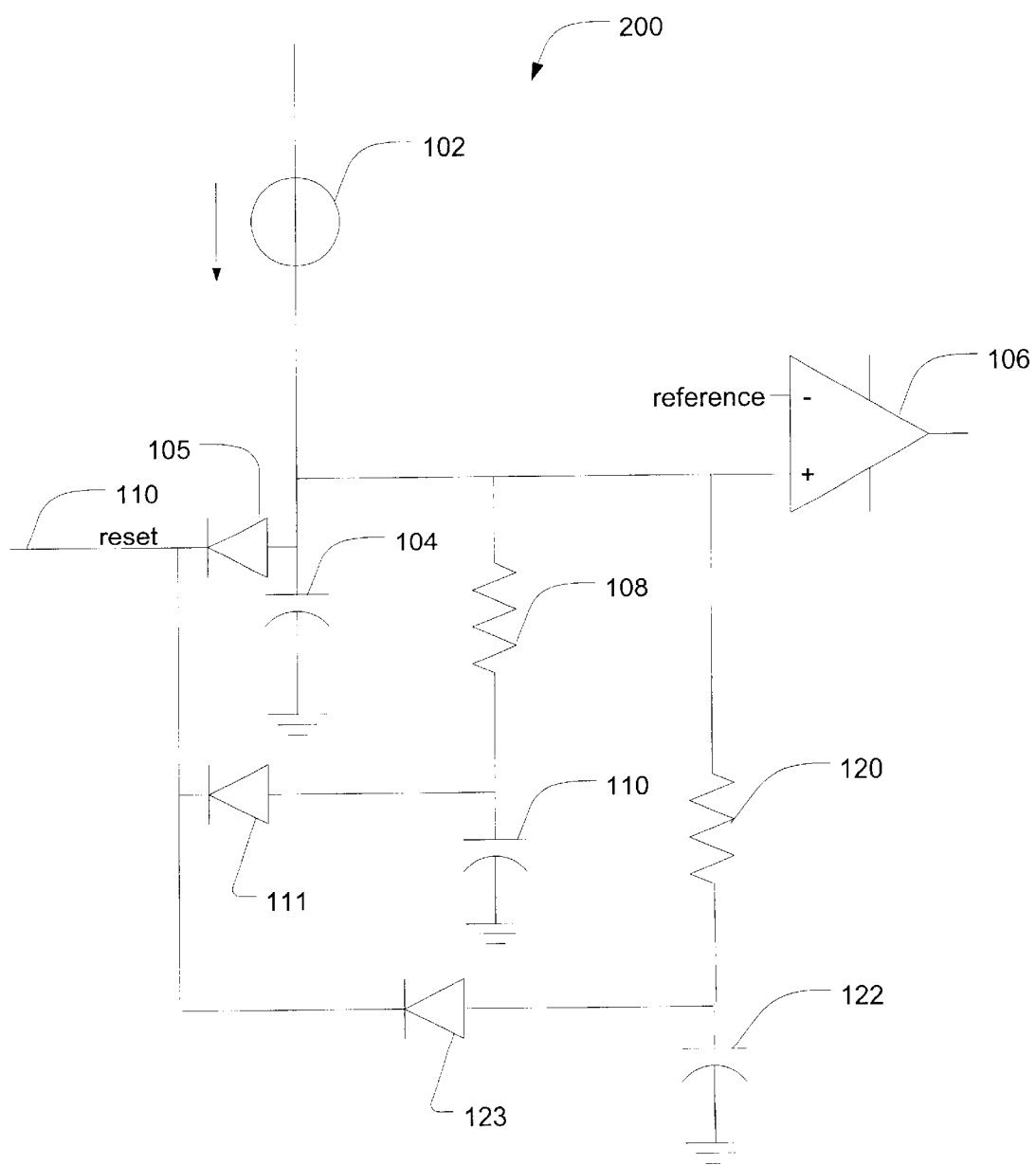
FIG. 3 is a schematic diagram of a timing circuit in another embodiment of the invention; and, FIG. 4 is a schematic diagram of a timing circuit in another embodiment of the invention.

FIG. 3 is a schematic diagram of a timing circuit 200 in an another embodiment of the invention. As shown in FIG. 3, another resistor 120 and capacitor 122 are placed in parallel with resistor 108 and capacitor 110 and capacitor 104. The addition of resistor 120 and capacitor 122 allows a wider dynamic range to be achieved while still using stable current levels. Capacitor 122 may be discharged through a diode 123 coupled to reset terminal 110. It is understood that additional RC branches may be connected to the first terminal of trigger circuit 106 to further enhance the dynamic range.

Figure 4:
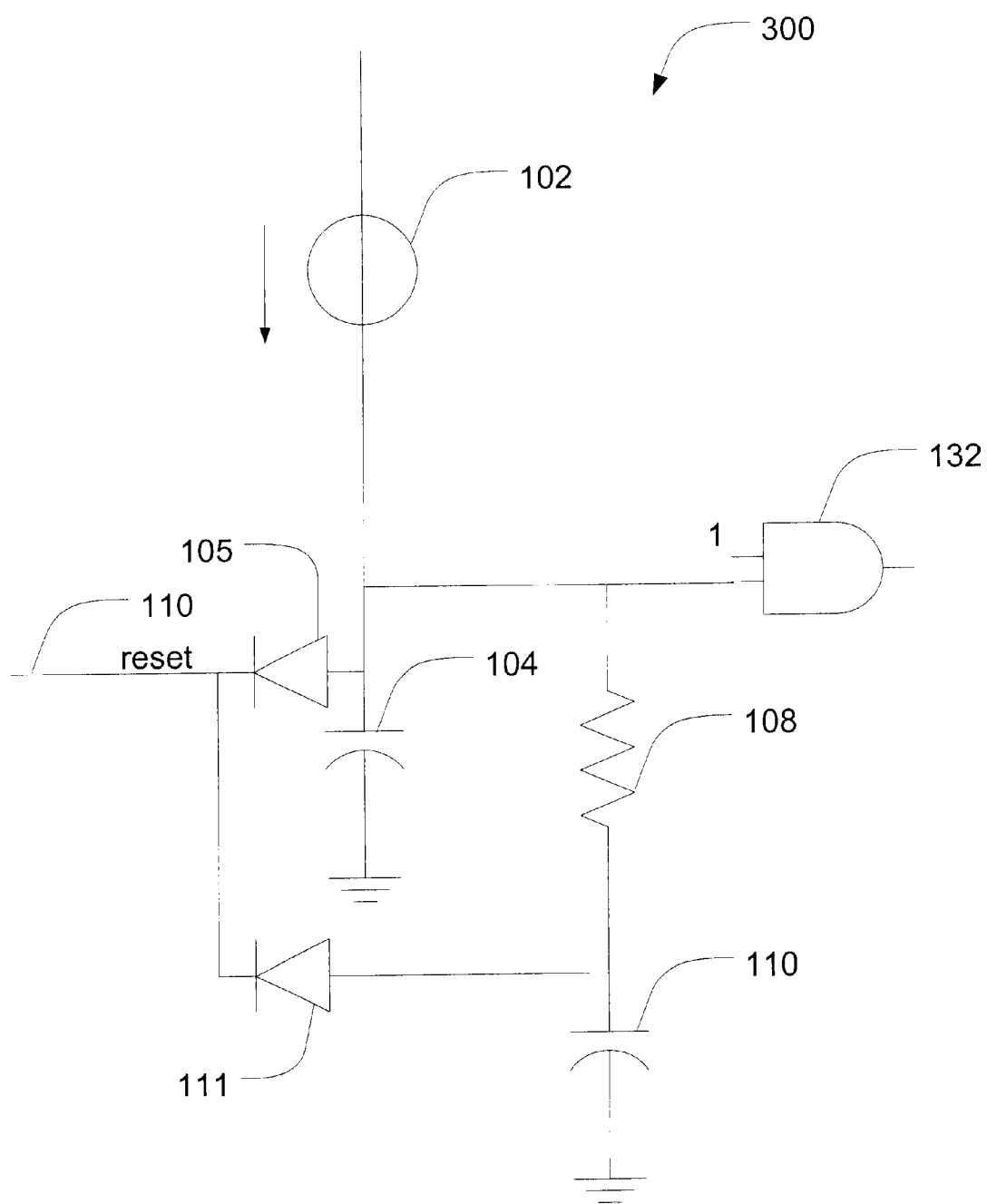

FIG. 4 depicts an alternate timing circuit 300 in which the trigger circuit is implemented using a logic gate 132 such as an AND gate. One input to the logic gate 132 is set to a voltage sufficient to establish logic 1 input to the logic gate. Once voltage at the other input to logic gate 132 reaches a reference level sufficient to establish a logic 1 (e.g., approximately 1.4 to 2.0 volts), the logic gate 132 switches states and the output becomes a logic 1. In this embodiment, the reference level is established by the characteristics of the logic gate 132. The voltage at the second input of the logic gate 132 is controlled by the charge on capacitor 104 and/or capacitor 10 as described above.

While the invention has been described with reference to exemplary embodiments, it will be understood by those skilled in the art that various changes may be made and equivalents may be substituted for elements thereof without departing from the essential scope thereof. Therefore, it is intended that the invention not be limited to the particular embodiments disclosed for carrying out the invention, but that the invention will include all embodiments falling within the scope of the appended claims.

What is claimed is:

1. A timing circuit comprising:

a current source;

a first capacitor coupled to said current source;

a first resistor and a second capacitor connected in series, the series first resistor and second capacitor being connected in parallel with said first capacitor;

a trigger circuit having a first terminal coupled to said first capacitor, said trigger circuit changing states of a trigger circuit output when a voltage at said first terminal exceeds a reference voltage;

said first capacitor and said second capacitor both configured to provide said voltage at said first terminal dependent upon current magnitude of said current source.

2. The timing circuit of claim 1 wherein said trigger circuit is an operational amplifier and the reference voltage is applied to a second terminal of the operational amplifier.

3. The timing circuit of claim 1 wherein said trigger circuit is a logic gate and the reference voltage is a voltage dictated by characteristics of said logic gate.

4. The timing circuit of claim 3 wherein said logic gate is an AND gate.

5. The timing circuit of claim 1 wherein a capacitance of said first capacitor is less than a capacitance of said second capacitor.

6. The timing circuit of claim 1 further comprising a first diode interconnecting a junction between said current source and said first capacitor and a first reset terminal, said first reset terminal being coupled to ground to discharge said capacitor.

7. The timing circuit of claim 5 further comprising a second diode interconnecting a junction between said first resistor and said second capacitor and said first reset terminal, said first reset terminal being coupled to ground to discharge said second capacitor.

8. The timing circuit of claim 1 further comprising a second resistor and a third capacitor connected in series, the series second resistor and third capacitor being connected in parallel with said first capacitor.

9. The timing circuit of claim 8 further comprising a third diode interconnecting a junction between said second resistor and said third capacitor and a second reset terminal, said second reset terminal being coupled to ground to discharge said third capacitor.

10. A timing circuit comprising:

a current source;

a first capacitor coupled to said current source;

a first resistor and a second capacitor connected in series, the series first resistor and second capacitor being connected in parallel with said first capacitor, wherein a capacitance of said first capacitor is less than a capacitance of said second capacitor;

an operational amplifier having a first terminal coupled to said first capacitor and a second terminal coupled to a reference voltage, said operational amplifier changing states of an operational amplifier output when a voltage at said first terminal exceeds the reference voltage;

a first diode interconnecting a junction between said current source and said first capacitor and a reset terminal, said reset terminal being coupled to ground to discharge said capacitor;

a second diode interconnecting a junction between said resistor and said second capacitor and said first reset terminal, said first reset terminal being coupled to ground to discharge said second capacitor.

11. The timing circuit of claim 10 further comprising a second resistor and a third capacitor connected in series, the series second resistor and third capacitor being connected in parallel with said first capacitor.

12. The timing circuit of claim 11 further comprising a third diode interconnecting a junction between said second resistor and said third capacitor and a second reset terminal, said second reset terminal being coupled to ground to discharge said third capacitor.

13. A timing circuit comprising:

a current source;

a first capacitor coupled to said current source;

a first resistor and a second capacitor connected in series, the series first resistor and second capacitor being connected in parallel with said first capacitor, wherein a capacitance of said first capacitor is less than a capacitance of said second capacitor;

a logic gate having a first terminal coupled to said first capacitor and a second terminal coupled to a voltage establishing a logic level, said logic gate changing states of a logic gate output when a voltage at said first terminal exceeds a reference voltage dictated by characteristics of said logic gate;

a first diode interconnecting a junction between said current source and said first capacitor and a first reset terminal, said first reset terminal being coupled to ground to discharge said first capacitor;

a second diode interconnecting a junction between said first resistor and said second capacitor and said first reset terminal, said first reset terminal being coupled to ground to discharge said second capacitor.

14. The timing circuit of claim 13 further comprising a second resistor and a third capacitor connected in series, the series second resistor and third capacitor being connected in parallel with said first capacitor.

15. The timing circuit of claim 14 further comprising a third diode interconnecting a junction between said second resistor and said third capacitor and a second reset terminal, said first reset terminal being coupled to ground to discharge said third capacitor.

16. The timing circuit of claim 13 wherein said logic gate is an AND gate.

* * * * *